(12) United States Patent
Kato et al.

(10) Patent No.: US 9,611,566 B2
(45) Date of Patent: Apr. 4, 2017

(54) METHOD FOR MANUFACTURING SINGLE-CRYSTAL SILICON

(75) Inventors: Hideo Kato, Gifu (JP); Shinichi Kyufu, Yamaguchi (JP); Masamichi Ohkubo, Burghausen (DE)

(73) Assignee: Siltronic AG, Munich (DE)

(*) Notice: Subject to any disclaimer, the term of this patent is extended or adjusted under 35 U.S.C. 154(b) by 330 days.

(21) Appl. No.: 14/362,360

(22) PCT Filed: May 15, 2012

(86) PCT No.: PCT/EP2012/059017
§ 371 (c)(1),
(2), (4) Date: Jun. 2, 2014

(87) PCT Pub. No.: WO2013/097951
PCT Pub. Date: Jul. 4, 2013

(65) Prior Publication Data
US 2014/0326173 A1 Nov. 6, 2014

(30) Foreign Application Priority Data

Dec. 26, 2011 (JP) ................................ 2011-283331

(51) Int. Cl.
| | |
|---|---|
| C30B 15/02 | (2006.01) |
| C30B 15/00 | (2006.01) |
| C30B 15/10 | (2006.01) |
| C30B 29/06 | (2006.01) |
| C30B 35/00 | (2006.01) |
| C30B 30/04 | (2006.01) |

(52) U.S. Cl.
CPC ............ C30B 15/005 (2013.01); C30B 15/02 (2013.01); C30B 15/10 (2013.01); C30B 29/06 (2013.01); C30B 30/04 (2013.01); C30B 35/002 (2013.01)

(58) Field of Classification Search
CPC ........ C30B 15/002; C30B 15/02; C30B 15/10
See application file for complete search history.

(56) References Cited

U.S. PATENT DOCUMENTS

| | | | |
|---|---|---|---|
| 5,779,792 A | 7/1998 | Atami et al. | |
| 5,980,629 A | 11/1999 | Hansen et al. | |
| 6,565,652 B1* | 5/2003 | Kononchuk | C30B 29/06 117/13 |
| 2002/0166499 A1 | 11/2002 | Kimura | |
| 2003/0106491 A1* | 6/2003 | Kemmochi | C03B 19/095 117/200 |
| 2004/0072007 A1* | 4/2004 | Kemmochi | B32B 5/16 428/544 |
| 2007/0051297 A1 | 3/2007 | Kemmochi et al. | |
| 2012/0006254 A1 | 1/2012 | Fujishiro et al. | |

FOREIGN PATENT DOCUMENTS

| | | |
|---|---|---|
| CN | 1152037 A | 6/1997 |
| CN | 1162028 A | 10/1997 |

(Continued)

*Primary Examiner* — Robert M Kunemund
(74) *Attorney, Agent, or Firm* — Brooks Kushman P.C.

(57) ABSTRACT

Single crystal silicon ingots are grown by the multi-pulling method in a single crucible with minimization of dislocations by incorporating barium as a quartz crystallization inhibitor in amounts proportional to the diameter of the Czochralski crucible in which the crystal is grown. In at least one of the crystal pulling steps, a magnetic field is applied.

8 Claims, 7 Drawing Sheets

(56) References Cited

FOREIGN PATENT DOCUMENTS

| | | | |
|---|---|---|---|
| CN | 102260902 A | 11/2011 |
| EP | 0748885 A1 | 12/1996 |
| EP | 1 076 120 A1 | 2/2001 |
| EP | 1348782 A2 | 10/2003 |
| JP | 09-110590 A | 4/1997 |
| JP | 2003160393 A | 6/2003 |
| JP | 2005145731 A | 6/2005 |
| JP | 2007001793 A | 1/2007 |
| JP | 2007176761 A | 7/2007 |
| JP | 2008081398 A | 4/2008 |
| JP | 2010030867 A | 2/2010 |
| JP | 2010184819 A | 8/2010 |
| WO | 01/63023 A1 | 8/2001 |
| WO | 0214587 A1 | 2/2002 |

* cited by examiner

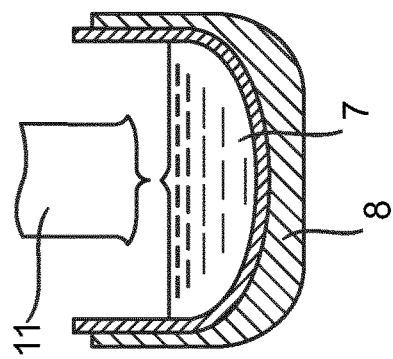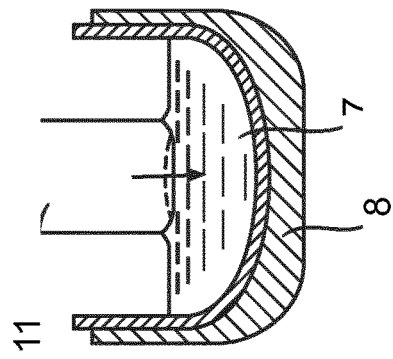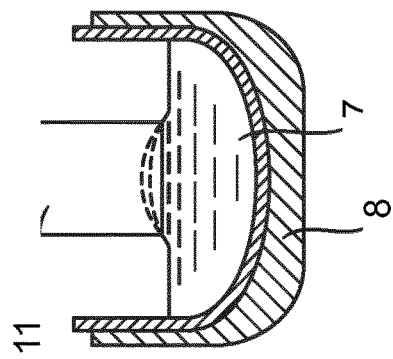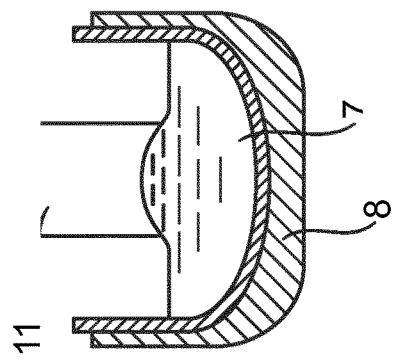

METHOD FOR MANUFACTURING SINGLE-CRYSTAL SILICON

This application is the U.S. National Phase of PCT Appln. No. PCT/EP2012/059017 filed May 15, 2012, which claims priority to Japanese Application No. JP2011-283331 filed Dec. 26, 2011, the disclosures of which are incorporated in their entirety by reference herein.

BACKGROUND OF THE INVENTION

1. Technical Field

The present invention relates to a method for manufacturing single-crystal silicon, and particularly to a method for manufacturing single-crystal silicon manufactured by a Czochralski method.

2. Description of the Related Art

The Czochralski method has been widely used in the manufacture of single-crystal silicon. In the Czochralski method, a polycrystalline material is melted in a quartz crucible, and a seed crystal is brought into contact with a material melt and is pulled up, thereby growing the single-crystal silicon.

Dislocation of the single-crystal silicon occurs in some cases during growth of the single-crystal silicon. It is pointed out that one of the reasons for dislocation of the single-crystal silicon is that cristobalite precipitated on an inner surface of the crucible made of quartz glass is released into the silicon melt and the cristobalite is taken into a silicon ingot when the silicon is pulled up.

Japanese Patent Laid-Open Application No. 9-110590 describes a method for promoting crystallization of quartz and preventing release of cristobalite by adhering a devitrification promoter containing an alkaline-earth metal such as barium to an inner surface of a quartz crucible.

Japanese Patent Laid-Open Application No. 2003-160393 describes a method for reducing the occurrence of dislocations during growth of single-crystal silicon by decreasing the concentration of a devitrification promoter, which is adhered to an inner surface of a quartz crucible, at a portion where the temperature during pulling-up of the single-crystal silicon is high, and increasing the concentration of the devitrification promoter at a portion where the temperature is low.

In recent years, single-crystal silicon has been manufactured using a multi-pulling method for pulling up a plurality of pieces of single-crystal silicon from a material melt in an identical crucible. According to this method, a single crystal is pulled up from the material melt, and then, a polycrystalline material is additionally charged into and melted in the remaining material melt without turning off a heater, and then, a next single crystal is pulled up. By repeating these steps of additionally charging the polycrystalline material into the material melt, melting the polycrystalline material in the material melt, and then pulling up a next single crystal, a plurality of pieces of single-crystal silicon are pulled up using the identical crucible.

When a plurality of silicon single crystals are pulled up in the identical crucible using the above-mentioned multi-pulling method, the operation takes a long time, and thus, the crucible is also exposed to high temperature for a long time. Even if a crucible having a devitrification promoter containing barium adhered thereto is used in the manufacture of the single-crystal silicon by the multi-pulling method, dislocations occur in some cases when the single-crystal silicon is separated from the material melt.

SUMMARY OF THE INVENTION

The present invention has been made in view of the above-mentioned problems, and an object of the present invention is to provide a method for manufacturing single-crystal silicon that makes it possible to reduce the occurrence of dislocations of the single-crystal silicon when the single-crystal silicon is grown using the multi-pulling method for pulling up a plurality of pieces of single-crystal silicon from a material melt in an identical crucible.

BRIEF DESCRIPTION OF THE DRAWINGS

FIG. 4(a) to (d) are explanatory views showing a process of change in shape of a growth face of the single-crystal silicon.

Figure 1:
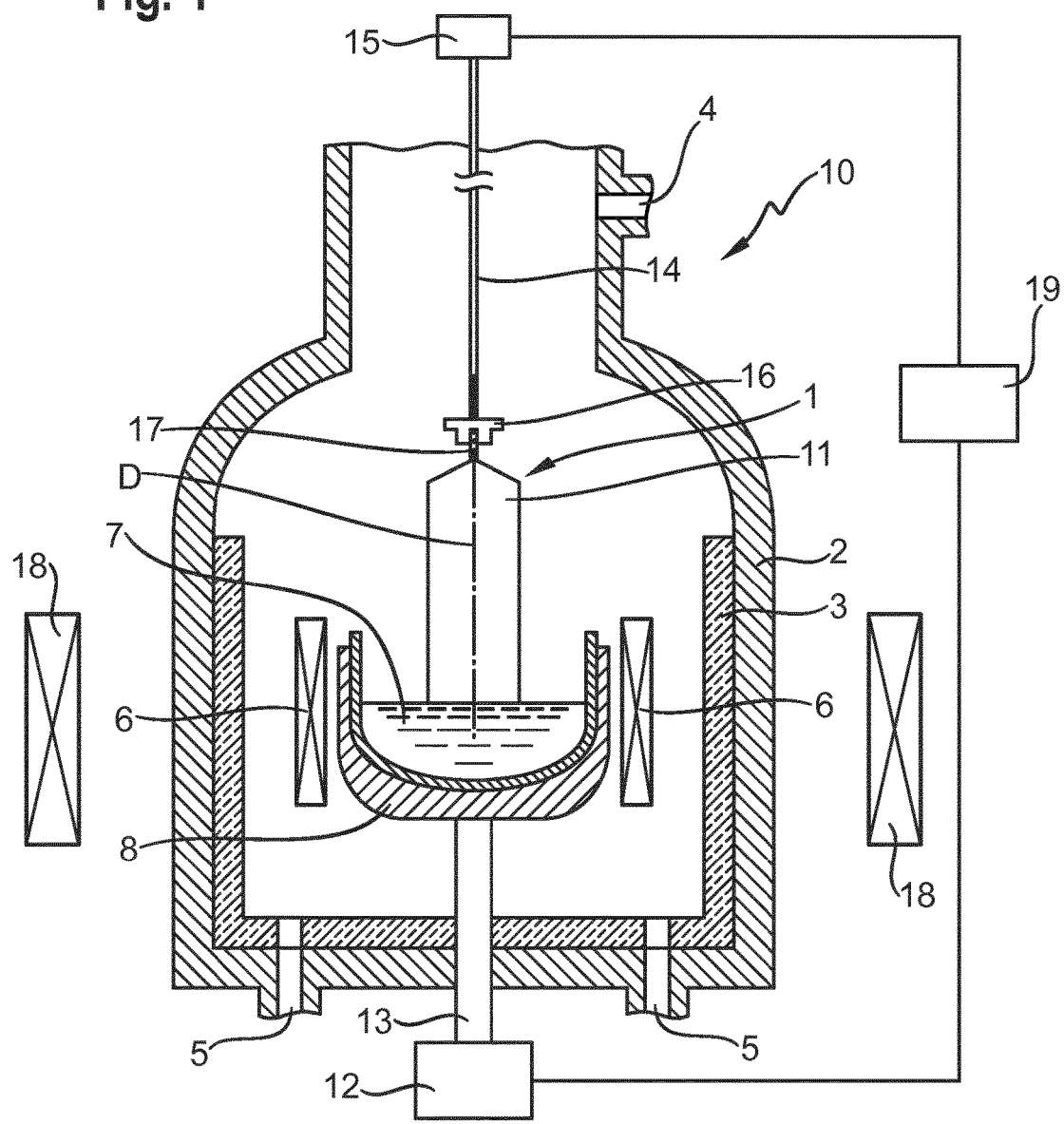
FIG. 1 is a schematic view showing a single-crystal silicon manufacturing device according to one embodiment of the invention.

As a result of earnest study, the inventors of the present invention have found that occurrences of dislocations of single-crystal silicon is affected by an amount (dose amount) of added barium on an inner wall surface of a crucible. When the amount (dose amount) of added barium is large, the rate of occurrence of dislocations of the single-crystal silicon is high. On the other hand, when the amount (dose amount) of added barium is small, the rate of occurrence of dislocations of the single-crystal silicon is low. When the amount (dose amount) of added barium becomes smaller than a certain amount (dose amount), the rate of occurrence of dislocation of the single-crystal silicon becomes high.

DETAILED DESCRIPTION OF THE PREFERRED EMBODIMENTS

The reason why the rate of occurrence of dislocation of the single-crystal silicon is high when the amount (dose amount) of added barium is large is considered to be as follows. First, barium is melted into a silicon melt from a denitrification promoter and the like adhered to the surface of the crucible. When single-crystal silicon is pulled up to a certain length from the silicon melt having the barium melted thereinto, and then, the single-crystal silicon is separated, silicon solidifies before cristobalite released into the silicon melt flows down from a tail part to the silicon melt, and the cristobalite is taken into the silicon as an impurity. As a result, dislocation occurs in the single-crystal silicon and the silicon is dislocated.

On the other hand, when the amount (dose amount) of added barium is extremely small, the rate of occurrence of dislocation of the single-crystal silicon is high. One of the reasons for this is considered to be as follows. When the amount (dose amount) of added barium is small, uniform crystallization of quartz on the inner wall of the crucible is not achieved, and thus, the cristobalite is released into the silicon melt and taken into the single-crystal silicon.

When the crucible has a large size, the temperature of the crucible during growth of the single-crystal silicon is high. High temperature of the crucible promotes crystallization. Therefore, the amount of barium melted into the silicon melt varies depending on the size of the crucible. Furthermore, even in the crucibles of the same size, the temperature of the crucible during growth of the single-crystal silicon is higher when the single-crystal silicon is pulled up with a magnetic field applied to the crucible than when a magnetic field is not applied to the crucible. Application of the magnetic field to the silicon melt allows suppression of convection of the silicon melt. Therefore, in order to maintain a condition similar to that when the magnetic field is not applied to the silicon melt, the temperature of the crucible must be raised.

The present invention has been made based on the above-mentioned findings. A method for manufacturing single-crystal silicon according to the present invention is directed to a method for manufacturing single-crystal silicon using a multi-pulling method for pulling up a plurality of pieces of single-crystal silicon from a material melt in an identical crucible within a chamber by a Czochralski method, the method having the following steps. The material melt is prepared in the crucible having a diameter of 24 inches. Single-crystal silicon is pulled up from the material melt. A polycrystalline material is additionally charged into and melted in the remaining material melt while continuing heating of the material melt. Next single-crystal silicon is pulled up from the material melt having the polycrystalline material additionally charged and melted therein. The step of additionally charging and melting the polycrystalline material and the step of pulling up next single-crystal silicon are repeated one or more times. In at least one of the step of pulling up single-crystal silicon and the step of pulling up next single-crystal silicon, which is repeated one or more times, the single-crystal silicon is grown in a magnetic field. A layer containing barium is formed on an inner wall of the crucible, and an amount of the barium added is $2.2 \times 10^{14}$ atoms·cm$^{-2}$ or more and $1.1 \times 10^{15}$ atoms·cm$^{-2}$ or less.

The amount of added barium herein refers to an amount of added barium on the inner surface of the crucible per unit area. The layer containing barium may be a layer of barium alone or a layer of a barium compound such as barium carbonate or barium hydroxide. Furthermore, the layer containing barium may be a barium-rich layer obtained by injecting barium onto the surface of the crucible.

A method for manufacturing single-crystal silicon according to the present invention is directed to a method for manufacturing single-crystal silicon using a multi-pulling method for pulling up a plurality of pieces of single-crystal silicon from a material melt in an identical crucible within a chamber by a Czochralski method, the method having the following steps. The material melt is prepared in the crucible having a diameter of 32 inches. Single-crystal silicon is pulled up from the material melt. A polycrystalline material is additionally charged into and melted in the remaining material melt while continuing heating of the material melt. Next single-crystal silicon is pulled up from the material melt having the polycrystalline material additionally charged and melted therein. The step of additionally charging and melting the polycrystalline material and the step of pulling up next single-crystal silicon are repeated one or more times. In at least one of the step of pulling up single-crystal silicon and the step of pulling up next single-crystal silicon, which is repeated one or more times, the single-crystal silicon is grown in a magnetic field. A layer containing barium is formed on an inner wall of the crucible, and an amount of the barium added is $5.4 \times 10^{13}$ atoms·cm$^{-2}$ or more and $2.2 \times 10^{14}$ atoms·cm$^{-2}$ or less.

A method for manufacturing single-crystal silicon according to the present invention is directed to a method for manufacturing single-crystal silicon using a multi-pulling method for pulling up a plurality of pieces of single-crystal silicon from a material melt in an identical crucible within a chamber by a Czochralski method, the method having the following steps. The material melt is prepared in the crucible having a diameter of 40 inches. Single-crystal silicon is pulled up from the material melt. A polycrystalline material is additionally charged into and melted in the remaining material melt while continuing heating of the material melt. Next single-crystal silicon is pulled up from the material melt having the polycrystalline material additionally charged and melted therein. The step of additionally charging and melting the polycrystalline material and the step of pulling up next single-crystal silicon are repeated one or more times. In at least one of the step of pulling up single-crystal silicon and the step of pulling up next single-crystal silicon, which is repeated one or more times, the single-crystal silicon is grown in a magnetic field. A layer containing barium is formed on an inner wall of the crucible, and an amount of the barium added is $1.1 \times 10^{13}$ atoms·cm$^{-2}$ or more and $5.4 \times 10^{13}$ atoms·cm$^{-2}$ or less.

Preferably, in the above-mentioned method for manufacturing single-crystal silicon, at least one of the step of pulling up single-crystal silicon and the step of pulling up next single-crystal silicon, which is repeated one or more times, includes a step of omitting at least a part of formation of a tail part of the single-crystal silicon and separating the single-crystal silicon from the material melt.

In the method for manufacturing single-crystal silicon according to the present invention, there can be reduced occurrence of dislocation of the single-crystal silicon when the single-crystal silicon is grown using the multi-pulling method for pulling up a plurality of pieces of single-crystal silicon from a material melt in an identical crucible.

Embodiments of the present invention will be described hereinafter with reference to the drawings, in which the same or corresponding portions are denoted by the same reference characters and description thereof will not be repeated.

First, a manufacturing device for manufacturing single-crystal silicon according to the present embodiment will be described with reference to FIG. 1.

As shown in FIG. 1, a single-crystal silicon manufacturing device 10 mainly has a chamber 2, a heater 6, a crucible 8, a crucible supporting shaft 13, a pulling-up wire 14, and a magnetic field generating coil 18. An inner wall of chamber 2 is provided with a heat insulating material 3. An inlet 4 through which an inert gas such as argon (Ar) is introduced is provided in the upper portion of chamber 2, and an outlet 5 through which the gas in chamber 2 is discharged is provided at the bottom of chamber 2. Crucible 8 is filled with solid silicon material to form a silicon melt 7. Heater 6 is provided around crucible 8 to melt the solid silicon material, and thereby the silicon melt 7 can be fabricated. Crucible supporting shaft 13 extends from a lower end of crucible 8 toward the bottom of the chamber and is rotatably supported by a crucible supporting shaft drive device 12. Crucible 8 can be moved up and down by crucible supporting shaft drive device 12. Pulling-up wire 14 is for pulling up single-crystal silicon 1, and can be moved up and down by a pulling-up wire drive device 15. Crucible supporting shaft drive device 12 and pulling-up wire drive device 15 are controlled by a control device 19. By passing a current through magnetic field generating coil 18, a magnetic field can be applied to the silicon melt. A layer containing barium is formed on the inner wall of the crucible 8. The layer containing barium may be a layer of barium alone or a layer of a barium compound such as barium carbonate or barium hydroxide.

Figure 2:
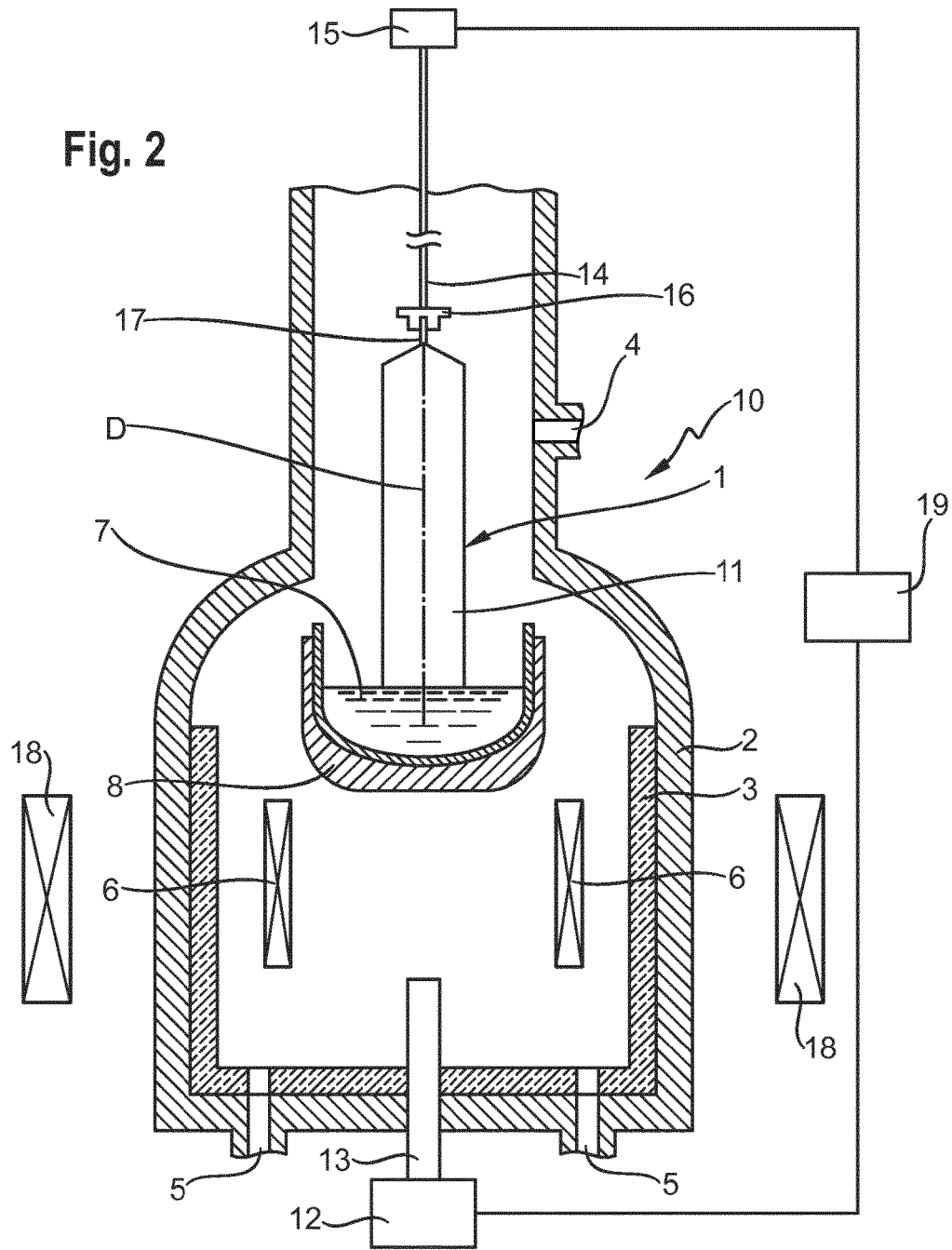
FIG. 2 is a schematic view showing one example of an operating state of the single-crystal silicon manufacturing device according to one embodiment of the invention.

Next, a method for manufacturing single-crystal silicon according to the present embodiment will be described with reference to FIGS. 1 to 3.

Figure 3:
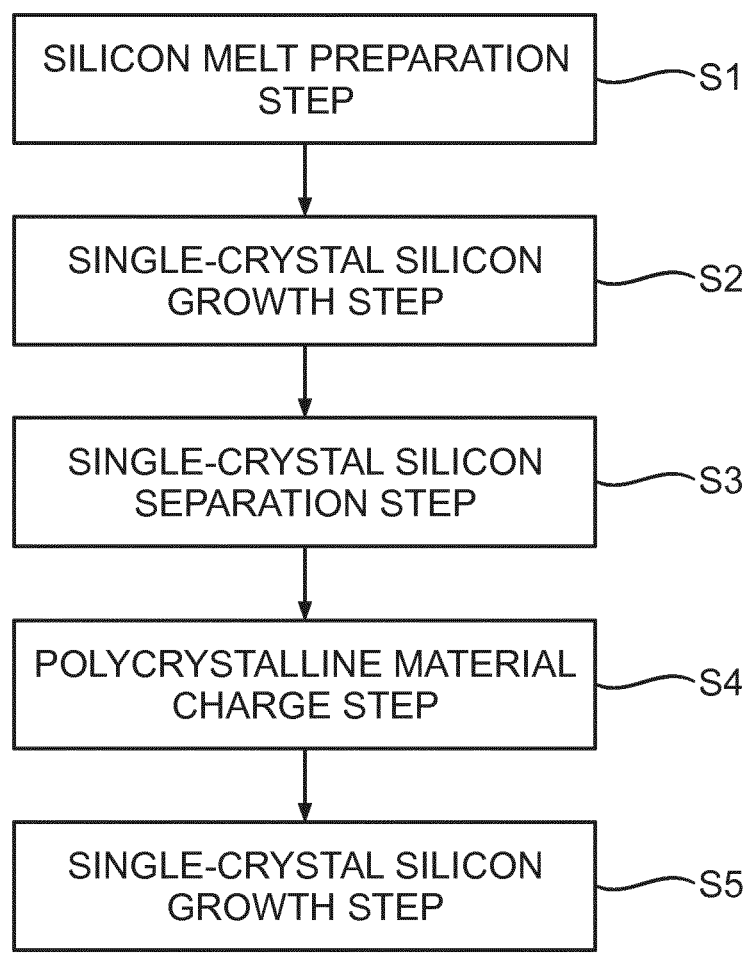
FIG. 3 is a flowchart showing a method for manufacturing single-crystal silicon according to one embodiment of the invention.

As shown in FIG. 3, the method for manufacturing single-crystal silicon according to the present embodiment is directed to a method for manufacturing single-crystal silicon using the multi-pulling method for pulling up a plurality of pieces of single-crystal silicon from a material melt in an identical crucible within a chamber by the Czochralski method, and mainly has a silicon melt preparation step S1, a single-crystal silicon growth step S2, a single-crystal silicon separation step S3, a polycrystalline material charge step S4, and a single-crystal silicon growth step S5.

In silicon melt preparation step S1, crucible 8 is filled with the solid silicon material, which is heated by heater 6 in order to melt the solid silicon material. Crucible 8 has a diameter of, for example, 18 inches, 24 inches, 32 inches, 40 inches and the like. The layer containing barium is formed on the inner wall of crucible 8. An amount (dose amount) of added barium varies depending on the size of crucible 8.

The amount of added barium when the crucible has a diameter of 18 inches and the magnetic field is not applied during growth of the single-crystal silicon is $1.4\times10^{16}$ atoms·cm$^{-2}$ or more and $5.4\times10^{16}$ atoms·cm$^{-2}$ or less. The amount of added barium when the crucible has a diameter of 24 inches and the magnetic field is not applied during growth of the single-crystal silicon is $5.4\times10^{15}$ atoms·cm$^{-2}$ or more and $2.7\times10^{16}$ atoms·cm$^{-2}$ or less. The amount of added barium when the crucible has a diameter of 32 inches and the magnetic field is not applied during growth of the single-crystal silicon is $1.4\times10^{15}$ atoms·cm$^{-2}$ or more and $5.4\times10^{15}$ atoms·cm$^{-2}$ or less.

As described below, the amount of added barium when the crucible has a diameter of 24 inches and the magnetic field is applied is $2.2\times10^{14}$ atoms·cm$^{-2}$ or more and $1.1\times10^{15}$ atoms·cm$^{-2}$ or less. The amount of added barium when the crucible has a diameter of 32 inches and the magnetic field is applied is $5.4\times10^{13}$ atoms·cm$^{-2}$ or more and $2.2\times10^{14}$ atoms·cm$^{-2}$ or less. The amount of added barium when the crucible has a diameter of 40 inches and the magnetic field is applied is $1.1\times10^{13}$ atoms·cm$^{-2}$ or more and $5.4\times10^{13}$ atoms·cm$^{-2}$ or less.

In single-crystal silicon growth step S2, a seed crystal 17 attached to a seed chuck 16 is first moved down to the surface of silicon melt 7 and immersed in silicon melt 7. Thereafter, pulling-up wire 14 is wound up by pulling-up wire drive device 15 to pull up single-crystal silicon 1. After single-crystal silicon 1 attains a target diameter through growth of a cone part (extended part), a straight part 11 is grown to have a predetermined length.

In single-crystal silicon separation step S3, straight part 11 is first grown to have the predetermined length, and then, winding-up of pulling-up wire 14 is stopped. Thereafter, crucible 8 is moved down to separate single-crystal silicon 1 from silicon melt 7. Although there are various methods as a method for separating the single-crystal silicon, it is preferable to separate the single-crystal silicon such that a tail part thereof is as short as possible, from the viewpoint of enhancing the yield. There is a method called "free span method (tail-coneless method)" as a method for separating the single-crystal silicon to achieve the short tail part. According to the free span method, when the length of the straight part reaches the predetermined length in pulling-up of single-crystal silicon 1, the crucible supporting shaft drive device starts moving up crucible 8. As shown in FIG. 2, the speed of moving up crucible 8 is set to be the same as the speed of moving up single-crystal silicon 1, and single-crystal silicon 1 and crucible 8 are moved up. When crucible 8 reaches a predetermined height, moving-up of crucible 8 by crucible supporting shaft drive device 12 and winding-up of pulling-up wire 14 are stopped. Thereafter, crucible supporting shaft drive device 12 causes crucible 8 to move down to separate single-crystal silicon 1 from silicon melt 7. With the above-mentioned method, single-crystal silicon 1 can be separated while minimizing formation of the tail part. It is to be noted that separation of the tail part may be implemented by a method other than the free span method.

Next, polycrystalline material charge step S4 is performed. In the polycrystalline material charge step, after single-crystal silicon 1 is separated from silicon melt 7, a polycrystalline material is additionally charged through a not-shown supply port into silicon melt 7 remaining in crucible 8, and the polycrystalline material is melted. When the polycrystalline material is additionally charged, heater 6 heating crucible 8 is not turned off. As a result, the polycrystalline material is charged into crucible 8 while continuing heating of crucible 8.

Next, single-crystal silicon growth step S5 is performed. In this step, next single-crystal silicon 1 is pulled up from the material melt (silicon melt 7) having the polycrystalline material additionally charged and melted therein. When straight part 11 reaches the predetermined length, single-crystal silicon 1 is separated from silicon melt 7.

The single-crystal silicon separation step, the step of additionally charging and melting the polycrystalline material, and the step of pulling up the next single-crystal silicon are repeated one or more times. As a result, a plurality of pieces of single-crystal silicon 1 can be pulled up. In at least one of the steps of pulling up the plurality of pieces of single-crystal silicon 1, the single-crystal silicon is grown in the magnetic field. Preferably, all of the steps of pulling up the plurality of pieces of single-crystal silicon 1 are performed in the magnetic field. At least one of the steps of pulling up the plurality of pieces of single-crystal silicon 1 may include a step of omitting at least a part of formation of the tail part of single-crystal silicon 1 and separating single-crystal silicon 1 from the material melt (silicon melt 7). Omission of at least a part of formation of the tail part also includes the case of separating the single-crystal silicon by the free span method after partially forming the tail part.

With reference to FIG. 4, description will be given to a process of change in shape of a growth face (interface with the material melt) of single-crystal silicon 1 when single-crystal silicon 1 is separated by the free span method. As shown in FIG. 4(a), the growth face of single-crystal silicon 1 during growth of straight part 11 has an upwardly convex shape. When crucible 8 starts moving up at the same speed as the pulling rate of single-crystal silicon 1, pulling-up of single-crystal silicon 1 stops substantially (the relative movement of crucible 8 and single-crystal silicon 1 in the vertical direction stops). Therefore, the upwardly convex shape of the growth face of single-crystal silicon 1 is gradually relieved as shown in FIG. 4(b). After this substantially stopped state is maintained for a predetermined time period, the shape of the growth face of single-crystal silicon 1 changes into a downwardly convex shape as shown in FIG. 4(c). By separating single-crystal silicon 1 from silicon melt 7 with the growth face of single-crystal silicon 1 having the downwardly convex shape, separation is achieved while minimizing bubbling of silicon melt 7 (FIG. 4(d)). As a result, single-crystal silicon 1 can be separated from silicon melt 7 while maintaining single-crystal silicon 1 in the dislocation-free state and minimizing the length of the tail.

Figure 5:
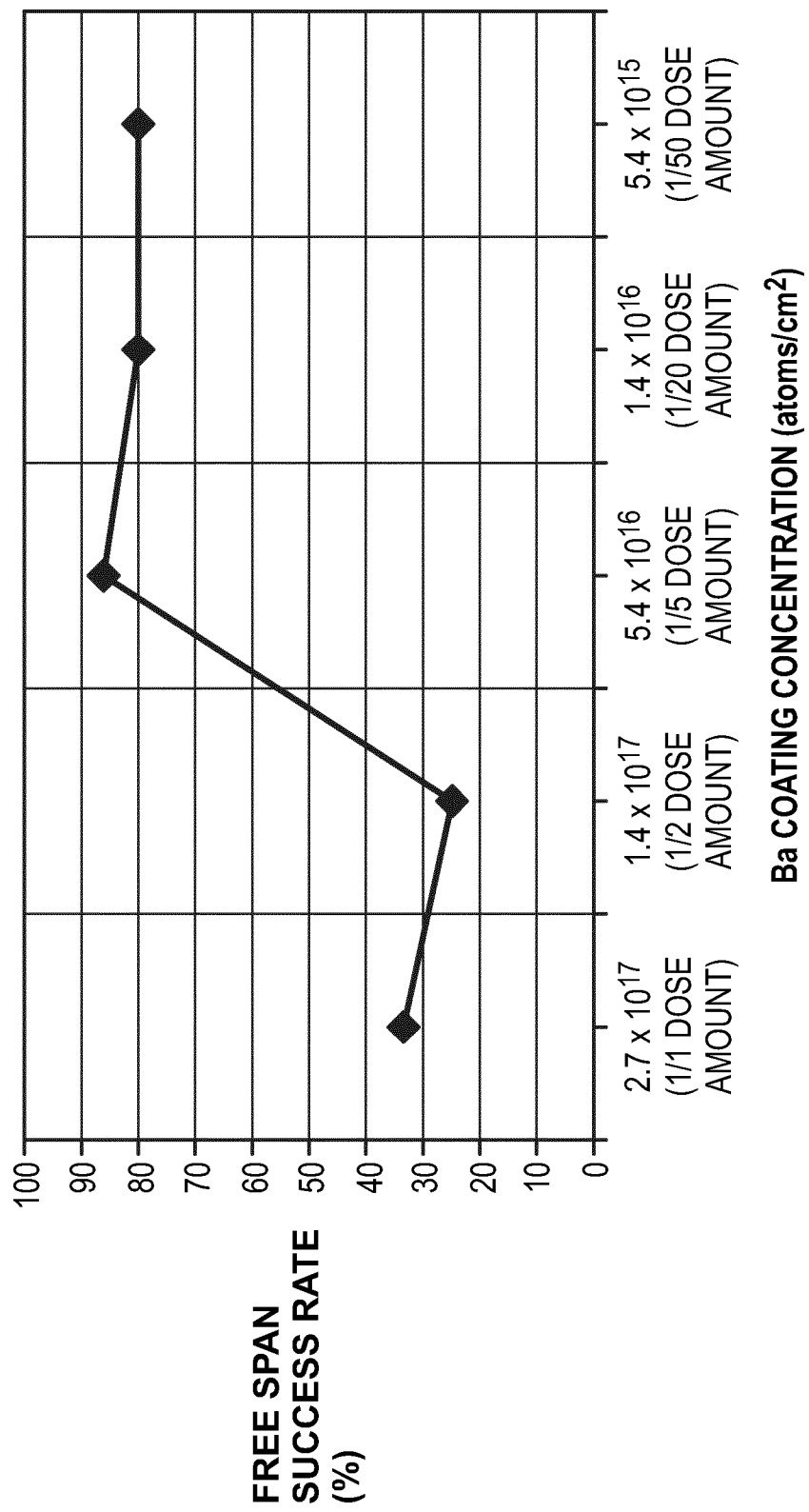
FIG. 5 shows a relationship between a free span success rate and a dose amount of barium.

In the free span method, crucible 8 containing silicon melt 7 is moved up at the same speed as the pulling rate of single-crystal silicon 1 during growth. As a result, pulling-up of single-crystal silicon 1 is substantially stopped without considerable change in heat history of single-crystal silicon 1, and in this state, single-crystal silicon 1 is separated from silicon melt 7. Consequently, a lower end face (i.e., interface with silicon melt 7) of single-crystal silicon 1 can have the downwardly convex shape, and the single-crystal silicon can be separated from silicon melt 7 with the single-crystal silicon maintained in the dislocation-free state. With reference to FIG. 5, description will be given to a relationship between a free span success rate when single-crystal silicon 1 is pulled up and an amount (dose amount) of addition of barium formed on the inner wall of 18-inch crucible 8. Data shown in FIG. 5 is obtained as a result of measurement without application of the magnetic field. The vertical axis indicates the free span success rate and the horizontal axis indicates the concentration of barium coating. The free span success rate refers to a ratio between the number of pulling-up of single-crystal silicon 1 and the number of pulling-up of single-crystal silicon 1 without dislocation by the free span method. In order to obtain the data, pulling-up of five single-crystal silicon 1 by the multi-pulling method is carried out ten times. The barium is added by spraying a barium hydroxide aqueous solution on the inner wall of crucible 8. As shown in FIG. 5, when the amount (dose amount) of added barium is $1.4 \times 10^{17}$ atoms·cm$^{-2}$ or more, the free span success rate is 40% or less. On the other hand, when the amount (dose amount) of added barium is $5.4 \times 10^{16}$ atoms·cm$^{-2}$ or less, the free span success rate is approximately 90% or more. One of the reasons why the free span success rate is low when the amount (dose amount) of added barium is large is considered to be as follows. The barium is dissolved in silicon melt 7 and taken into the silicon when single-crystal silicon 1 is pulled up, thereby dislocating the silicon.

Figure 6:
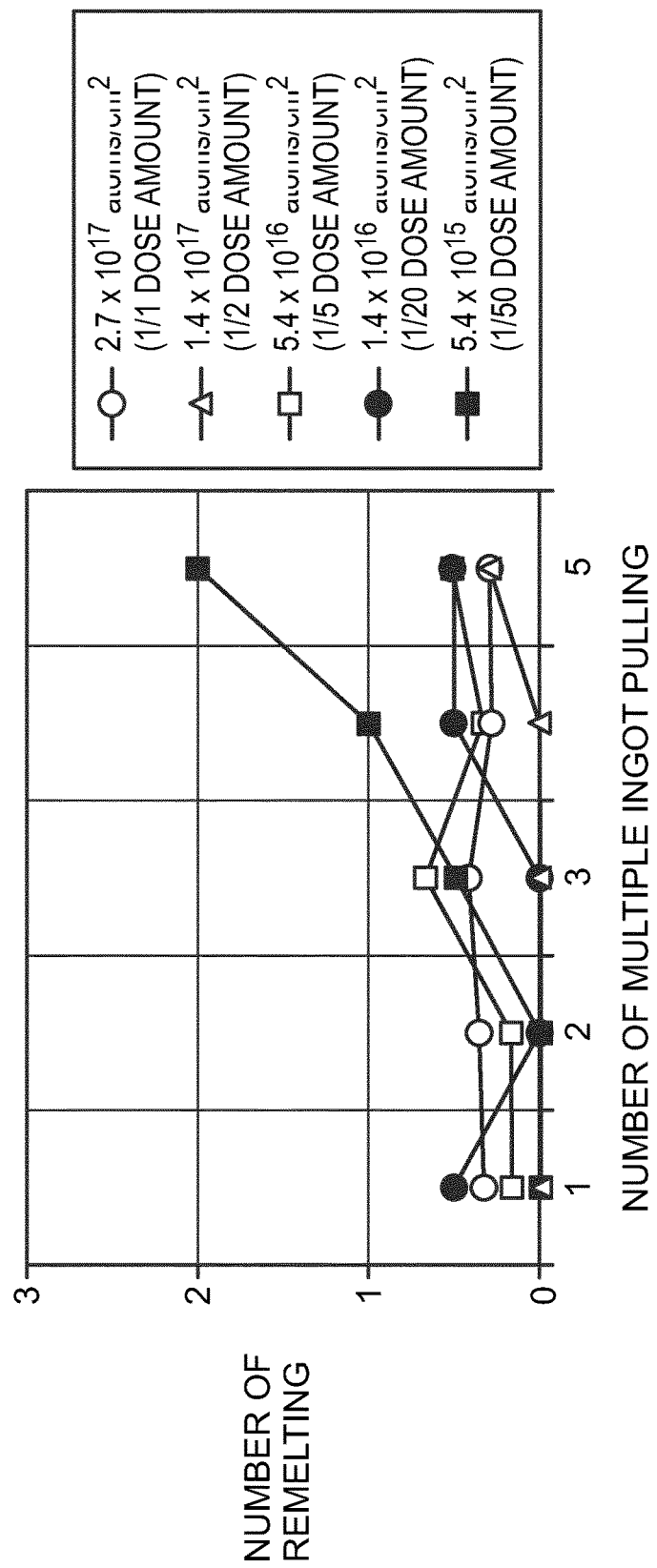
FIG. 6 shows a relationship between the number of remelting and the number of pulled-up silicon ingots.

With reference to FIG. 6, description will be given to a relationship between the number of remelting steps and the number of pulled-up silicon ingots. Data shown in FIG. 6 is obtained as a result of measurement without application of the magnetic field. The vertical axis indicates the number of remelting and the horizontal axis indicates the number of pulled-up ingots. Data indicated by a white circle is data when the concentration (dose amount) of barium coating is $2.7 \times 10^{17}$ atoms/cm$^2$. Data indicated by a white triangle is data when the concentration (dose amount) of barium coating is $1.4 \times 10^{17}$ atoms/cm$^2$. Data indicated by a white square is data when the concentration (dose amount) of barium coating is $5.4 \times 10^{16}$ atoms/cm$^2$. Data indicated by a black circle is data when the concentration (dose amount) of barium coating is $1.4 \times 10^{16}$ atoms/cm$^2$. Data indicated by a black square is data when the concentration (dose amount) of barium coating is $5.4 \times 10^{15}$ atoms/cm$^2$. If single-crystal silicon 1 is dislocated during pulling-up of single-crystal silicon 1, dislocated single-crystal silicon 1 is moved down and again melted into silicon melt 7. Thereafter, pulling-up of single-crystal silicon 1 is restarted. The number of remelting refers to the average number of remelting of single-crystal silicon 1 into silicon melt 7 when single-crystal silicon 1 is dislocated. The number of pulled-up ingots refers to the number of pulled-up ingots when a plurality of pieces of single-crystal silicon 1 is pulled up using the multi-pulling method.

Referring to FIG. 6, when the amount (dose amount) of added barium is $1.4 \times 10^{16}$ atoms·cm$^{-2}$ or more, the number of remelting steps remain nearly unchanged even when the number of pulled-up ingots is five. However, when the amount (dose amount) of added barium is $5.4 \times 10^{15}$ atoms·cm$^{-2}$ or less, the number of remelting increases as the number of pulled-up ingots increases. As the number of remelting steps increases, the operation time becomes longer, which leads to an extreme decrease in productivity. In addition, heat load is applied to crucible 8 for a long time, and thus, crucible 8 may break. Therefore, in view of productivity and heat load to crucible 8, the amount of added barium is desirably $1.4 \times 10^{16}$ atoms·cm$^{-2}$ or more.

Figure 7:
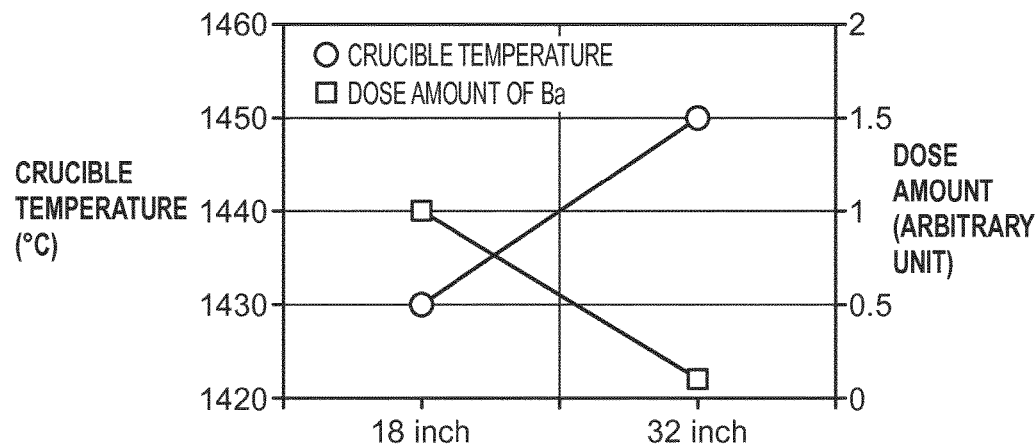
FIG. 7 shows a relationship between a temperature of a crucible and a size of the crucible as well as a relationship between a dose amount of barium and a size of the crucible.

With reference to FIG. 7, description will be given to a relationship between the temperature of crucible 8 and the size of crucible 8 as well as a relationship between the dose amount of barium and the size of crucible 8. Data shown in FIG. 7 is obtained as a result of measurement without application of the magnetic field. The vertical axis on the left indicates the temperature of crucible 8 and the vertical axis on the right indicates the dose amount of barium. The horizontal axis indicates the diameter of crucible 8. When a large-size crucible 8 is used, the temperature of crucible 8 must be raised in order to maintain the state of silicon melt 7 in crucible 8 under the conditions similar to those when small-size crucibles 8 are used. High temperature of crucible 8 promotes crystallization of the barium adhered to the inner wall of crucible 8. As crystallization of the barium is promoted, the amount of the barium melted into silicon melt 7 decreases. Therefore, an optimum amount (dose amount) of added barium varies depending on the size of crucible 8. Generally, an amount of change in temperature of crucible 8 is in inverse proportion to a rate of change in optimum amount (dose amount) of added barium. For example, when the temperature of crucible 8 rises by 20° C., the amount (dose amount) of added barium must be decreased by a factor of 10. When the temperature of crucible 8 rises by 50° C., the amount (dose amount) of added barium must be decreased by a factor of 25.

As shown in FIG. 7, when the diameter of crucible 8 is changed from 18 inches to 32 inches, the temperature of crucible 8 in pulling-up of single-crystal silicon 1 must be changed from 1430° C. (18 inches) to 1450° C. (32 inches). When the temperature of crucible 8 rises by 20° C., the amount (dose amount) of added barium must be decreased by a factor of 10. The optimum amount of added barium when crucible 8 has a diameter of 18 inches is $1.4 \times 10^{16}$ atoms·cm$^{-2}$ or more and $5.4 \times 10^{16}$ atoms·cm$^{-2}$ or less. Therefore, the optimum amount of added barium when crucible 8 has a diameter of 32 inches is $1.4 \times 10^{15}$ atoms·cm$^{-2}$ or more and $5.4 \times 10^{15}$ atoms·cm$^{-2}$ or less. Similarly, the optimum amount of added barium when crucible 8 has a diameter of 24 inches is $5.4 \times 10^{15}$ atoms·cm$^{-2}$ or more and $2.7 \times 10^{16}$ atoms·cm$^{-2}$ or less.

Figure 8:
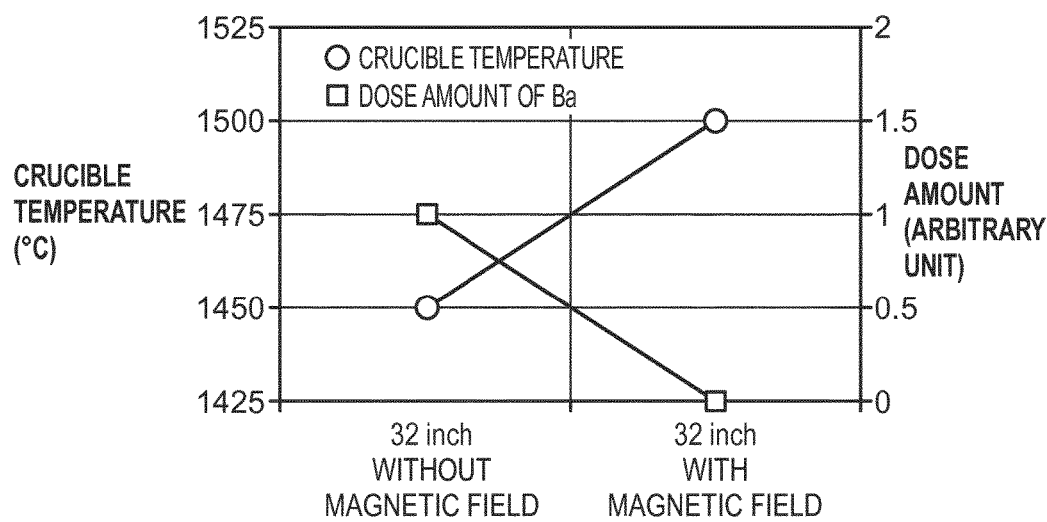
FIG. 8 shows a relationship between a temperature of the crucible and presence or absence of a magnetic field as well as a relationship between a dose amount of barium and presence or absence of the magnetic field.

With reference to FIG. 8, description will be given to a relationship between the temperature of crucible 8 and presence or absence of the magnetic field as well as a relationship between the dose amount of barium and presence or absence of the magnetic field. Crucible 8 has a size of 32 inches. The vertical axis on the left indicates the temperature of crucible 8 and the vertical axis on the right indicates the dose amount of barium. The horizontal axis indicates presence or absence of the magnetic field. As shown in FIG. 8, even in crucibles 8 of the same size, the temperature of crucible 8 during growth of single-crystal silicon 1 must be higher when the single-crystal silicon is pulled up with the magnetic field applied to crucible 8 than when the magnetic field is not applied to crucible 8. Application of the magnetic field to silicon melt 7 allows suppression of convection of silicon melt 7. Therefore, in order to maintain the conditions similar to that when the magnetic field is not applied to silicon melt 7, the temperature of crucible 8 must be raised. As shown in FIG. 8, the temperature of the crucible without the magnetic field is 1450° C., while the temperature of crucible 8 with the magnetic field must be 1500° C.

As described with reference to FIG. 7, when the temperature of crucible 8 becomes higher, the optimum amount (dose amount) of added barium must be decreased. Since the temperature of crucible 8 rises by 50° C. when the magnetic field is applied, the amount (dose amount) of added barium must be decreased by a factor of 25. Therefore, the optimum amount of added barium when crucible 8 has a diameter of 24 inches and the magnetic field is applied is $2.2 \times 10^{14}$ atoms·cm$^{-2}$ or more and $1.1 \times 10^{15}$ atoms·cm$^{-2}$ or less. The optimum amount of added barium when crucible 8 has a diameter of 32 inches and the magnetic field is applied is $5.4 \times 10^{13}$ atoms·cm$^{-2}$ or more and $2.2 \times 10^{14}$ atoms·cm$^{-2}$ or less. The optimum amount of added barium when crucible 8 has a diameter of 40 inches and the magnetic field is applied is $1.1 \times 10^{13}$ atoms·cm$^{-2}$ or more and $5.4 \times 10^{13}$ atoms·cm$^{-2}$ or less.

The dose amount of added barium refers to an amount of barium adhered to or contained on the inner surface of crucible 8 per square centimeter surface area, which is expressed in the number of atoms.

Next, description will be given to a method for forming the layer containing barium on the inner surface of crucible 8.

First, a barium hydroxide aqueous solution, for example, is prepared as the layer containing barium (denitrification promoter). Next, the barium hydroxide aqueous solution is sprayed on quartz crucible 8 heated to 200 to 300° C. The barium hydroxide aqueous solution is applied using a spraying method while rotating crucible 8. An amount of adhering of the layer containing barium can be controlled in accordance with the spraying time and the like.

The layer containing barium may be formed on the inner surface of crucible 8 at a uniform amount of addition, or may be formed at different amounts of addition depending on positions on the inner surface of crucible 8. For example, a large amount of barium may be added at the bottom of crucible 8, and a small amount of barium may be added at a sidewall part and the bottom of crucible 8.

It should be understood that the embodiment disclosed herein is illustrative and not limitative in any respect. The scope of the present invention is defined by the terms of the claims, rather than the embodiment above, and is intended to include any modifications within the scope and meaning equivalent to the terms of the claims.

The invention claimed is:

1. A method for manufacturing single-crystal silicon using a multi-pulling method for pulling up a plurality of pieces of single-crystal silicon from a material melt in an identical crucible within a chamber by a Czochralski method, the method comprising the steps of:
    preparing said material melt in said crucible, wherein the crucible has a diameter of 24 inches or more, and a layer containing barium is formed on an inner wall of the crucible in an amount related to the diameter of the crucible such that the amount of barium is about $2.2 \times 10^{14}$ atoms·cm$^{-2}$ for a crucible of 24 inch diameter, $5.4 \times 10^{13}$ atoms·cm$^{-2}$ or more and $2.2 \times 10^{14}$ atoms·cm$^{-2}$ or less for a crucible of 32 inch diameter, and $1.1 \times 10^{13}$ atoms·cm$^{-2}$ or more and $5.4 \times 10^{13}$ atoms·cm$^{-2}$ or less for a crucible of 40 inch diameter;
    pulling up a single-crystal silicon from the material melt;
    additionally charging a polycrystalline material into a material melt remaining after pulling up the single-crystal silicon and melting the polycrystalline material in the material melt while continuing heating of the material melt; and
    pulling up a further single-crystal silicon from the material melt having had the polycrystalline material additionally charged and melted therein, wherein
    the step of additionally charging and melting the polycrystalline material and the step of pulling up the further single-crystal silicon are repeated one or more times, wherein
    in at least one of the steps of pulling up a single-crystal silicon or the step of pulling up a further single-crystal silicon, which is repeated one or more times, the single-crystal silicon is grown in a magnetic field.

2. The method for manufacturing single-crystal silicon of claim 1, wherein
    at least one of the steps of pulling up a single-crystal silicon or the step of pulling up a further single-crystal silicon, which is repeated one or more times, includes a step of omitting at least a part of formation of a tail part of the single-crystal silicon and separating the single-crystal silicon from the material melt.

3. The method for manufacturing single-crystal silicon using a multi-pulling method of claim 1, wherein the crucible selected a is 32 inch nominal diameter crucible having a layer containing barium on the inner wall of the crucible in an amount of from $\geq 5.4 \times 10^{13}$ atoms·cm$^{-2}$ to $\leq 2.2 \times 10^{14}$ atoms·cm$^{-2}$.

4. The method for manufacturing single-crystal silicon using a multi-pulling method of claim 1, wherein the crucible selected is a 40 inch nominal diameter crucible having a layer containing barium on the inner wall of the crucible in an amount of from $\geq 1.1 \times 10^{13}$ atoms·cm$^{-2}$ to $\leq 5.4 \times 10^{13}$ atoms·cm$^{-2}$.

5. The method for manufacturing single-crystal silicon using a multi-pulling method of claim 1, wherein the layer containing barium is prepared by spraying an aqueous solution of a barium salt onto the inside of the previously formed crucible.

6. The method of claim 5, wherein the aqueous solution of a barium salt is an aqueous solution of barium carbonate or barium hydroxide.

7. The method of claim 5, wherein the aqueous solution of a barium salt is an aqueous solution of barium hydroxide.

8. The method of claim 5, wherein the amount of barium is varied at different portions of the inner crucible walls by varying the amount of the aqueous solution of barium salt sprayed onto the inside of the crucible at different portions of the inner crucible walls.

* * * * *